(12) United States Patent
Lin (10) Patent No.: US 11,196,431 B1
(45) Date of Patent: Dec. 7, 2021

(54) HIGH-SPEED TIME DIVISION DUPLEXING TRANSCEIVER FOR WIRED COMMUNICATION AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 17/140,175

(22) Filed: Jan. 4, 2021

(51) Int. Cl.
| | | |
|---|---|---|
| *H03M 1/00* | (2006.01) | |
| *H03M 1/66* | (2006.01) | |
| *H03M 3/00* | (2006.01) | |
| *H03M 1/12* | (2006.01) | |

(52) U.S. Cl.
CPC ......... *H03M 1/001* (2013.01); *H03M 1/1215* (2013.01); *H03M 1/1245* (2013.01); *H03M 1/66* (2013.01); *H03M 3/464* (2013.01)

(58) Field of Classification Search
CPC ...... H03M 1/001; H03M 1/66; H03M 1/1245; H03M 3/464; H03M 1/1215

USPC ................................ 341/143; 375/219, 346
See application file for complete search history.

(56) References Cited

U.S. PATENT DOCUMENTS 6,028,891 A * 2/2000 Ribner ................... H04L 5/023
375/222
10,498,298 B1 * 12/2019 Wang ...................... H03F 3/245

* cited by examiner

*Primary Examiner* — Khai M Nguyen
(74) *Attorney, Agent, or Firm* — McClure, Qualey & Rodack, LLP (57) ABSTRACT

A transceiver includes a medium dependent interface configured to provide AC (alternate current) coupling between a first node and a second node; a broadband matching network 120 configured to couple the second node to a third node; a programmable gain amplifier configured to receive a third voltage signal at the third node and output a fourth voltage signal in accordance with a first logical signal; an analog-to-digital converter configured to receive the fourth voltage signal and output a first data in accordance with the first logical signal and a first clock; and a digital-to-analog converter configured to receive a second data and output a first current signal to the third node in accordance with a second logical signal and a second clock, wherein: the first logical signal and the second logical signal are asserted alternately.

20 Claims, 6 Drawing Sheets

HIGH-SPEED TIME DIVISION DUPLEXING TRANSCEIVER FOR WIRED COMMUNICATION AND METHOD THEREOF

BACKGROUND OF THE DISCLOSURE

Field of the Disclosure

The present disclosure generally relates to time division duplexing transceivers and more particularly to high-speed time division duplexing transceivers having reduced signal interference.

Description of Related Art

A conventional wired communication system comprises a first transceiver, a second transceiver, and a communication medium. The first transceiver encodes a first message into a first signal that is transmitted via the communication medium and received and decoded by the second transceiver. The second transceiver encodes a second message into a second signal that is transmitted via the communication medium and received and decoded by the first transceiver. The communication medium is shared by the transmission of the first signal and the transmission of the second signal in accordance with a duplexing scheme. The communication medium is, for instance, a cable. There are three duplexing schemes: full duplexing (FD), frequency division duplexing (FDD), and time division duplexing (TDD). In the FD scheme, the first signal and the second signal are transmitted concurrently and overlapped in frequency domain; this is the most efficient scheme of utilizing a capacity of the communication medium but is technically most difficult to implement due to a strong interference between the first signal and the second signal. In the FDD scheme, the first signal and the second signal are transmitted concurrently but nominally non-overlapped in frequency domain; the interference between the first signal and the second signal is greatly reduced but not completely eliminated due to a nonzero side-lobe leakage in the frequency domain, and therefore this scheme requires sharp filtering to mitigate the interference. In the TDD scheme, the first signal and the second signal are transmitted alternately; the interference between the first signal and the second signal can be significantly eliminated, provided there is a sufficient guard interval to secure a clean handover between the transmission of the first signal and the transmission of the second signal. The guard interval, however, cannot be used for transmitting the first signal nor the second signal, and thus is considered an overhead that accounts for a loss in the efficiency of utilizing the capacity of the communication medium.

While the FD scheme is highly efficient, it very difficult to implement when a high throughput application is sought, e.g. 10 Gigabit per second over 15 m twist-pair cable. The FDD scheme is also difficult to implement for a high throughput application due to a need of a sharp filter response with a high cut-off frequency. In comparison, the TDD scheme is relatively easier to implement for a high throughput application. However, a transceiver of the TDD scheme still needs to handle a few issues. First, an impedance matching is needed at the interface with the communication medium for both the first signal and the second signal, otherwise an undesired reflection might occur and results in interference. Second, a fast handover is desired to reduce the overhead and efficiency loss in utilizing the communication medium due to the guard interval. Third, the transceiver must have a fast response in processing the first signal and the second signal, since a high throughput application requires the first signal and the second signal to be fast changing to carry a large amount of message in a short time.

What is desired is a transceiver that can be used in a high-speed TDD scheme and effectively handle the aforementioned issues.

SUMMARY OF THE DISCLOSURE

In an embodiment, a transceiver comprises: a medium dependent interface configured to provide AC (alternate current) coupling between a first voltage signal at a first node and a second voltage signal at a second node; a broadband matching network 120 configured to couple the second voltage signal at the second node to a third voltage signal at a third node; a programmable gain amplifier configured to receive the third voltage signal and output a fourth voltage signal in accordance with a first logical signal; an analog-to-digital converter configured to receive the fourth voltage signal and output a first data in accordance with the first logical signal and a first clock; and a digital-to-analog converter configured to receive a second data and output a first current signal to the third node in accordance with a second logical signal and a second clock, wherein: the first logical signal and the second logical signal are asserted alternately.

In an embodiment, a method of time division duplexing comprises: using a medium dependent interface to provide AC (alternate current) coupling between a first voltage signal at a first node and a second voltage signal at a second node; using a broadband matching network to couple the second voltage signal to a third voltage signal at a third node; using a programmable gain amplifier to amplify the third voltage signal into a fourth voltage signal in accordance with a first logical signal; using an analog-to-digital converter to convert the fourth voltage signal into a first data in accordance with the first logical signal and a first clock; and using a digital-to-analog converter to convert a second data into a first current signal output to the third node in accordance with a second logical signal and a second clock, wherein: the first logical signal and the second logical signal are asserted alternately.

DETAILED DESCRIPTION OF THIS DISCLOSURE

The present disclosure is directed to time division duplexing transceivers and related methods thereof. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "circuit node," "power supply node," "ground node," "differential signal," "differential pair," "voltage," "current," "CMOS (complementary metal oxide semiconductor)," "PMOS (P-channel metal oxide semiconductor) transistor," "NMOS (N-channel metal oxide semiconductor) transistor," "resistor," "inductor," "capacitor," "clock," "signal," "amplifier," "common-source," "impedance," "impedance matching," "return loss," "AC (alternate current)," "AC (alternate current) couple," "DC (direct current)," "DC (direct current) couple," "gain," "cascode," and "load." Terms and basic concepts like these, when used in a context of microelectronics, are apparent to those of ordinary skill in the art and thus will not be explained in detail here.

Those of ordinary skills in the art can read schematics of a circuit comprising components such as capacitors, inductors, resistors, NMOS transistors, PMOS transistors, and so on, and do not need a verbose description about how one component connects with another in the schematics. Those of ordinary skill in the art can also recognize symbols of PMOS transistor and NMOS transistor, and identify the "source terminal," the "gate terminal," and the "drain terminal" thereof. Pertaining to a MOS transistor, for brevity, hereafter, "source terminal" is simply referred to as "source," "gate terminal" is simply referred to "gate," and "drain terminal" is simply referred to "drain." An NMOS transistor has a threshold voltage; the NMOS transistor is turned on when a voltage at its gate is higher than a voltage at its source by more than its threshold voltage and turned off otherwise. A PMOS transistor has a threshold voltage; the PMOS transistor is turned on when a voltage at its gate is lower than a voltage at its source by more than its threshold voltage and turned off otherwise. Those of ordinary skill in the art also understand units such as GHz (giga-Hertz), μm (micron), nm (nanometer), Ohm (Ohm), nH (nano-Henry), fF (femto-Farad), and pF (pico-Farad).

A MOS transistor, PMOS or NMOS, has a width and a channel length. Sometimes, "channel length" is simply stated as "length" for short when it is obvious from the context that the "length" refers to the "channel length" of the transistor without causing confusion. Width and length of a MOS transistor are referred by a notation "W/L." For instance, when it is said that "W/L of an NMOS transistor are 10 μm/30 nm," it means that "width and length of an NMOS transistor are 10 μm and 30 nm, respectively."

This disclosure is presented in an engineering sense, instead of a rigorous mathematical sense. For instance, "A is equal to B" means "a difference between A and B is smaller than an engineering tolerance. "X is zero" means "an absolute value of X is smaller than an engineering tolerance."

In this disclosure, a "circuit node" is frequently simply stated as a "node" for short, when what it means is clear from a context.

Throughout this disclosure, a ground node is a node of substantially zero voltage (0V). A power supply node is a node of a substantially fixed voltage and is denoted by "$V_{DD}$," which is a convention widely used in the literature. Since there are multiple power supply nodes including a first power supply node and a second power supply node in this disclosure, for distinction the first power supply node is denoted as "$V_{DD1}$" and the second power supply node is denoted as "$V_{DD2}$." In this disclosure, depending on a context that is apparent to those of ordinary skill in the art, sometimes "$V_{DD1}$" refers to the voltage level at the first power supply node "$V_{DD1}$." For instance, it is apparent that "$V_{DD1}$ is 1.8V" means that the voltage level at the first power supply node $V_{DD1}$ is 1.8V.

A circuit is a collection of a transistor, a capacitor, a resistor, and/or other electronic devices inter-connected in a certain manner to embody a certain function. A network is a circuit or a collection of circuits.

In this present disclosure, a signal is either a voltage or a current of a variable level that carry a certain information and can vary with time. A level of the signal at a moment represents a state of the signal at that moment.

A logical signal is a voltage signal of two states: a low state and a high state. The low state is also known as a "0" state, while the high stage is also known as a "1" state. Regarding a logical signal Q, "Q is high" or "Q is low" means that "Q is in the high state" or "Q is in the low state." Likewise, "Q is 1" or "Q is 0," means that "Q is in the 1 state" or "Q is in the 0 state." In this disclosure, the high state is also stated as an "asserted" state while the low state is also stated as a "de-asserted" state.

A clock is a logical signal that cyclically toggles back and forth between a low state and a high state.

A logical signal X is said to be a logical inversion of a logical signal Y if the state of X is always opposite to the state of Y. That is, when X is high, Y will be low, and vice versa.

A data carry information that are usually expressed in a numerical representation. A data can be time varying and can be encoded into a collection of time-varying logical signals.

A switch is controlled by a logical signal; the switch is in an "on" state and behaves like a short circuit when the logical signal is asserted; the switch is in an "off" state and behaves like an open circuit when the logical signal is de-asserted. A short circuit has a nominally zero resistance. An open circuit has a nominally infinite resistance.

When a MOS transistor is used to embody a switch, it is controlled by a control signal that is a logical signal applied at a gate of the MOS transistor. A switch embodied by an NMOS transistor is in an "on" state when the control signal is high, and in an "off" state when the control signal is low.

Throughout this disclosure, a differential signaling scheme is widely used. When embodied in a differential signaling scheme, a voltage signal comprises two voltages denoted with suffixes "+" and "−," respectively, attached in subscript, and a value of the voltage signal is represented by a difference between said two voltages. For instance, a voltage signal $V_1$ ($V_2$, $V_3$, $V_4$) in a differential signaling embodiment comprises $V_{1+}$ ($V_{2+}$, $V_{3+}$, $V_{4+}$) and $V_{1-}$ ($V_{2-}$, $V_{3-}$, $V_{4-}$) and a value of the voltage signal $V_1$ ($V_2$, $V_3$, $V_4$) is represented by a difference between $V_{1+}$ ($V_{2+}$, $V_{3+}$, $V_{4+}$)

and $V_{1-}$ ($V_{2-}$, $V_{3-}$, $V_{4-}$). Likewise, when embodied in a differential signaling scheme, a current signal comprises two currents denoted with suffixes "+" and "−," respectively, attached in subscript. For instance, a current signal $I_1$ in a differential signaling embodiment comprises $I_{1+}$ and $I_{1-}$ and a value of $I_1$ is represented by a difference between $I_{1+}$ and Every circuit of a signal embodied in a differential signaling scheme comprises two half circuits including a first half circuit and a second half circuit; the first half circuit is identical with the second half circuit; a node in the first half circuit denoted with suffix "+" attached in subscript has a counterpart node in the second half circuit that is denoted with suffix "−" attached in subscript. For instance, a voltage signal $V_1$ at a node 101, when embodied in a differential signaling scheme, comprises voltage $V_{1+}$ at node $101_+$ in a first half circuit and voltage $V_{1-}$ at node $101_-$ in a second half circuit.

Figure 1:
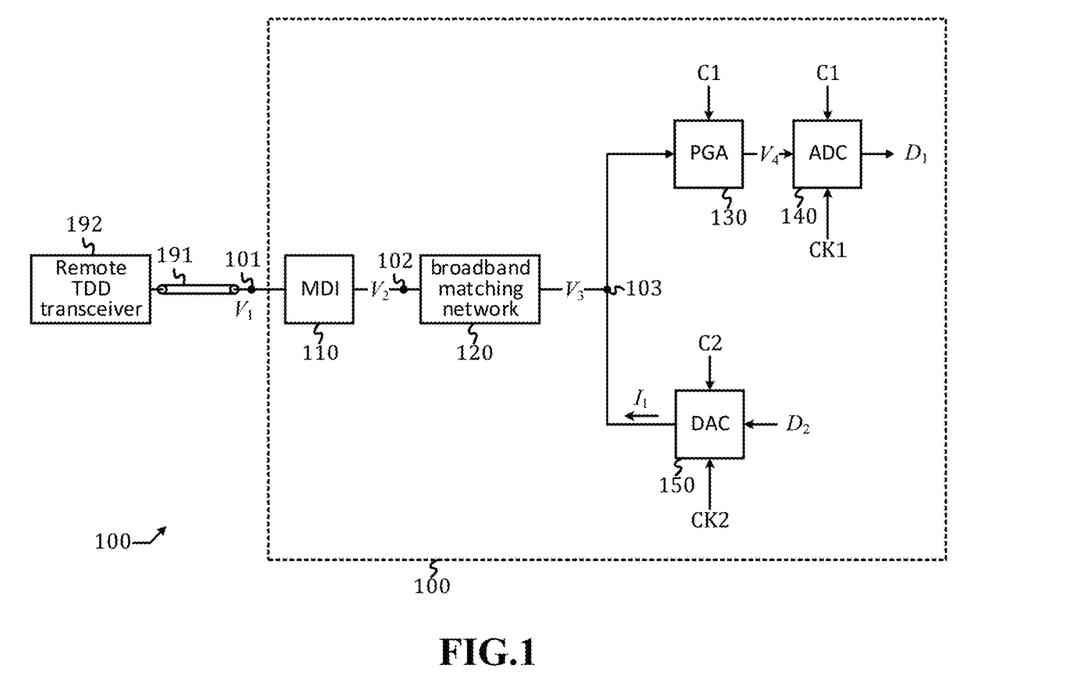
FIG. 1 shows a functional block diagram of a TDD (time division duplexing) transceiver in accordance with an embodiment of the present disclosure.

A functional block diagram of a time division duplexing (TDD) transceiver 100 in accordance with an embodiment of the present disclosure is shown in FIG. 1. TDD transceiver 100 comprises: a medium dependent interface (MDI) 110 configured to provide AC (alternate current) coupling between at a first voltage signal $V_1$ at a first node 101 and a second voltage signal $V_2$ at a second node 102; a broadband matching network 120 configured to couple the second voltage signal $V_2$ at the second node 102 to a third voltage signal $V_3$ at a third node 103; a programmable gain amplifier (PGA) 130 configured to receive the third voltage signal $V_3$ and output a fourth voltage signal $V_4$ in accordance with a first logical signal C1; an ADC (analog-to-digital converter) 140 configured to receive the fourth voltage signal $V_4$ and output a first data $D_1$ in accordance with the first logical signal C1 and a first clock CK1; and a DAC (digital-to-analog converter) 150 configured to receive a second data $D_2$ and output a first current signal $I_1$ to the third node 103 in accordance with a second logical signal C2 and a second clock CK2. The first node 101 is connected to a communication medium 191. When the first logical signal C1 is asserted, the TDD transceiver 100 is in a receiver mode, wherein the first voltage signal $V_1$ is transmitted by a remote TDD transceiver 192 and arrives at the first node 101 via the communication medium 191. When the second logical signal C2 is asserted, the TDD transceiver 100 is in a transmitter mode, wherein the first voltage signal $V_1$ is transmitted by the TDD transceiver 100 and received by the remote TDD transceiver 192 via the communication medium 191. The first logical C1 and the second logical C2 are asserted alternately. They cannot be asserted at the same time, but can be de-asserted at the same time.

In an embodiment, a differential signaling scheme is used for the first (second, third, fourth) voltage signal $V_1$ ($V_2$, $V_3$, $V_4$), wherein $V_1$ ($V_2$, $V_3$, $V_4$) comprises $V_{1+}$ ($V_{2+}$, $V_{3+}$, $V_{4+}$) and $V_{1-}$ ($V_{2-}$, $V_{3-}$, $V_{4-}$) and a value of $V_1$ ($V_2$, $V_3$, $V_4$) is represented by a difference between $V_{1+}$ ($V_{2+}$, $V_{3+}$, $V_{4+}$) and $V_{1-}$ ($V_{2-}$, $V_{3-}$, $V_{4-}$), as explained earlier. Likewise, a differential signaling scheme is used for the first current signal $I_1$, wherein $I_1$ comprises $I_{1+}$ and $I_{1-}$ and a value of $I_1$ is represented by a difference between $I_{1+}$ and $I_{1-}$.

By way of example but not limitation, the communication medium 191 is a cable of a characteristic impedance $Z_0$.

Figure 2A:
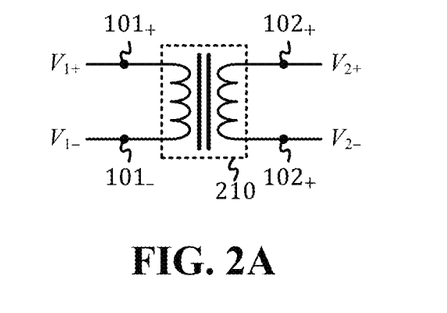
FIG. 2A shows an embodiment of a medium dependent interface that can be used in the TDD transceiver of FIG. 1.
Figure 2B:
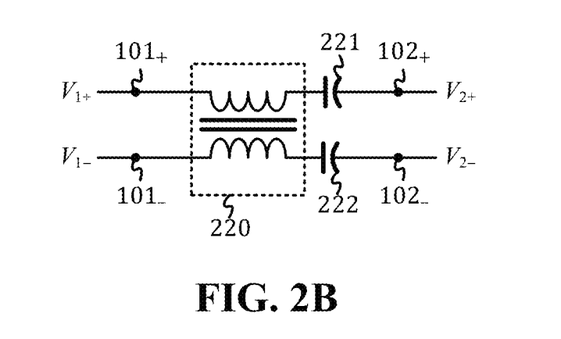
FIG. 2B shows another embodiment of a medium dependent interface that can be used in the TDD transceiver of FIG. 1.

The MDI 110 provides AC coupling between the first node 101 and the second node 102. In an embodiment, the MDI 110 comprises a transformer 210, as shown in FIG. 2A. In another embodiment, MDI 110 comprises a common-mode choke 220 and a pair of capacitors 221 and 222, as shown in FIG. 2B. Transformers, common-mode chokes, and capacitors are all well known in the prior art and thus not explained in detail. In either embodiment, an AC (alternate current) component of the first voltage signal $V_1$ is substantially shorted to an AC component of the second voltage signal $V_2$. Consequently, an impedance looking from the MDI 110 into broadband matching network 120 is substantially equal to an impedance looking from the communication medium 191 into the MDI 110.

In an embodiment, the whole TDD transceiver 100 excluding the MDI 110 is integrated and fabricated on a silicon substrate using a CMOS process technology. By way of example but not limitation, a 28 nm CMOS process technology with a minimum channel length of 30 nm is used.

Figure 3A:
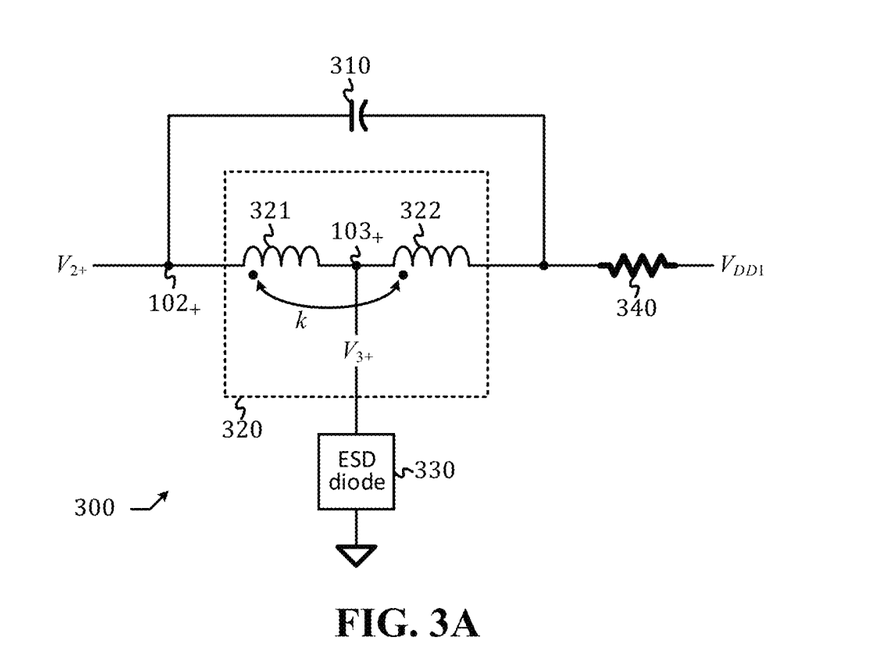
FIG. 3A shows a schematic diagram of a half circuit of a broadband matching network that can be used in the TDD transceiver of FIG. 1.
Figure 3B:
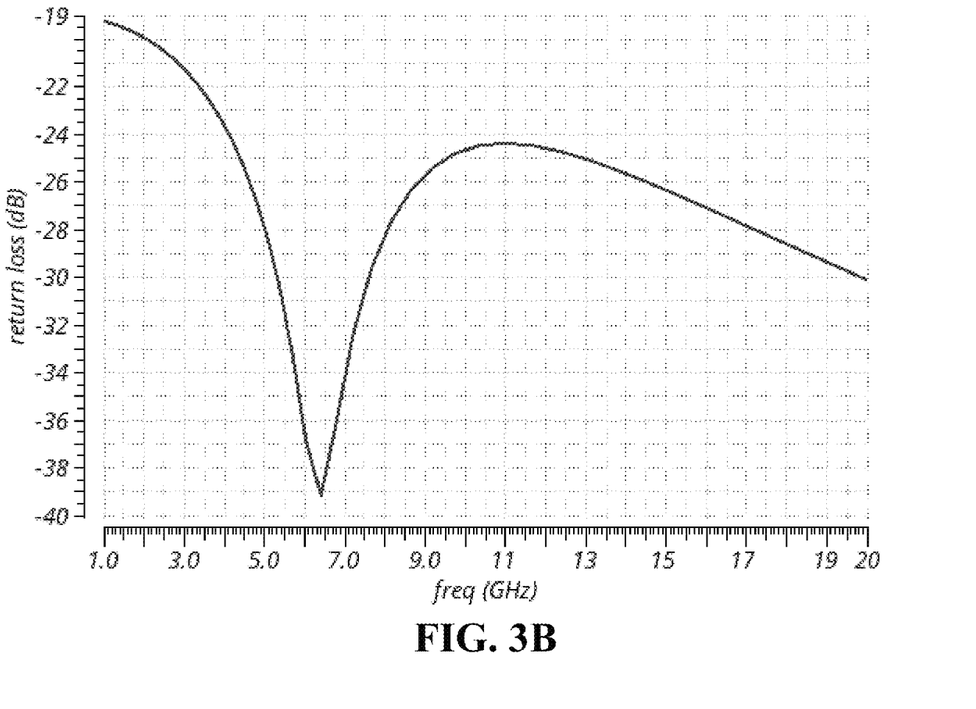
FIG. 3B shows a simulation result of a return loss of a broadband matching network in accordance with an embodiment of the present disclosure.

A purpose of the broadband matching network 120 is to ensure that an input impedance looking from the MDI 110 into the broadband matching network 120 is substantially equal to the characteristic impedance $Z_0$ of the communication medium 191. A schematic diagram of an embodiment of a broadband matching network 300 that can be used to embody the broadband matching network 120 is depicted in FIG. 3A. For brevity, only a half circuit is shown, wherein a suffix "+" attached in the suffix is used for the half circuit notation. The broadband matching network 300 comprises: a T-coil inductor 320, a capacitor 310, an ESD (electrostatic discharge) diode 330, and a resistor 340. Here, "$V_{DD1}$" denotes a first power supply node. For this half circuit, an input impedance needs to be equal to half of the characteristic impedance $Z_0$, therefore a resistance of the resistor 340 is chosen to be half of $Z_0$. The T-coil inductor 320 comprises two coupled inductors 321 and 322 with a coupling coefficient k, wherein a center tap of the T-coil inductor 320 is connected to node 103+. The ESD diode 330 is used to clamp the voltage $V_{3+}$ at node 103+ to prevent damage and thus protect the TDD transceiver 100 in case of an electrostatic discharge event. To have an effective protection, a physical size of the ESD diode 330 must be large, and it leads to a large parasitic capacitance at node 103+. The T-coil inductor 320 is used to mitigate a capacitive load at node 103+, while capacitor 310 is used to achieve a broadband response. When an input impedance looking into node 102+ is approximately equal to half of $Z_0$, a return loss of the broadband matching network 300 will be very small. By way of example but not limitation: $Z_0$ is 100 Ohm; $V_{DD1}$ is 1.5V; inductor 321 is 1 nH with a quality factor of 10 at 10 GHz; inductor 322 is 1 nH with a quality factor of 10 at 10 GHz; the coupling coefficient k is 0.25; resistor 340 is 50 Ohm; capacitor 310 is 150 fF; and a total parasitic capacitance at node 103+ is 1 pF. A simulation result of a return loss (for a voltage source with a 50-Ohm impedance that connects to node 102+) is shown in FIG. 3B. As shown, the return loss is small and below −19 dB over a very wide frequency range (from 1 GHz to 20 GHz). This shows a broadband matching purpose is fulfilled. The concepts of "impedance matching" and "return loss" are well understood by those of ordinary skills in the art and thus not explained in detail.

Figure 4:
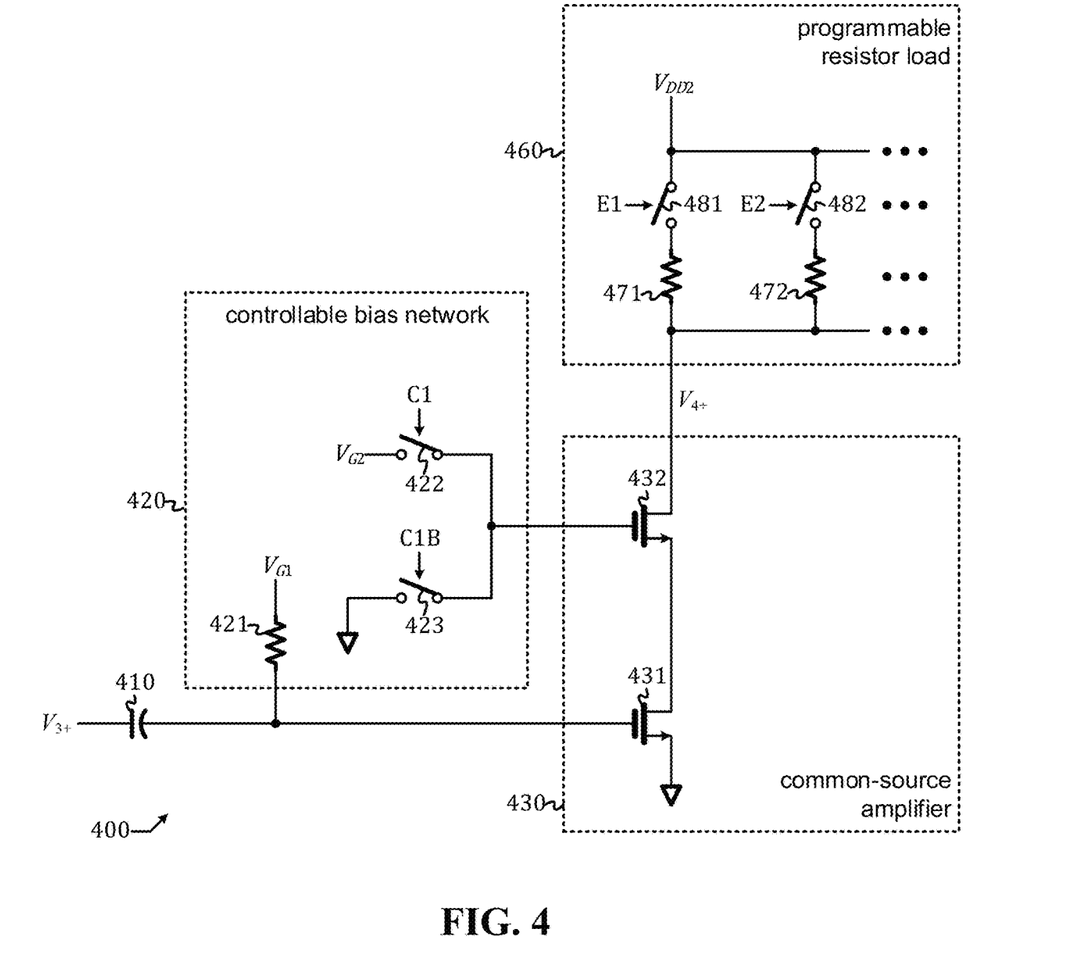
FIG. 4 shows a schematic diagram of a programmable gain amplifier that can be used in the TDD transceiver of FIG. 1.

A schematic diagram of a PGA 400 that can be used to embody the PGA 130 is shown in FIG. 4. Again, a differential signaling scheme is used and only a half circuit is shown for brevity. The PGA 400 comprises: a common-source amplifier 430 configured to receive $V_{3+}$ via an AC (alternate current) coupling capacitor 410 and output $V_{4+}$ at a programmable resistor load 460; and a controllable bias network 420 configured to determine a biasing condition of the common-source amplifier 430 in accordance with the first logical signal C1. Here, "$V_{DD2}$" denotes a second power supply node. The common-source amplifier 430 comprises a gain device embodied by NMOS transistor 431 and a cascode device embodied by NMOS transistor 432. The controllable bias network 420 comprises: a DC (direct current) coupling resistor 421 configured to couple a first gate voltage $V_{G1}$ to the gate of NMOS transistor 431; a switch 422 configured to connect a second gate voltage $V_{G2}$ to the gate of NMOS transistor 432 in accordance with the first logical signal C1; and another switch 423 configured to connect a ground node to the gate of NMOS transistor 432 in accordance with C1B, which is a logical inversion of the first logical signal C1. When the first logical signal C1 is asserted, the gate of the NMOS transistor is connected to $V_{G2}$ and turned on. When the first logical signal C1 is de-asserted, C1B is asserted, and the gate of NMOS transistor 432 is tied to the ground node and thus shut off. This way, the common-source amplifier 430 is turned on when C1 is asserted and shut off otherwise. The programmable resistor load 460 comprises a plurality of resistors 471, 472, and so on, in series with a plurality of switches 481, 482, and so on, controlled by a plurality of logical signals E1, E2, and so on, respectively. This way, a net resistance of the programmable resistor load 460 is programmable and depending on said plurality of logical signals E1, E2, and so on. A gain of a common-source amplifier depends on a resistance of a resistor load of the common-source amplifier. Therefore, a gain of the common-source amplifier 430 depends on a net resistance of the programmable resistor load 460 and is thus programmable. A function of a programmable gain is thus fulfilled.

PGA 400 can have a fast handover as it can react very fast to a change of the first logical signal C1 by using switches of low resistance and having a light capacitive load. PGA 400 can also have a high bandwidth to handle a fast-changing signal thanks to using an open-loop amplifier topology that is inherently fast but stable. In an embodiment, by way of example but not limitation: $V_{DD2}$ is 1.05V; W/L (which stands for width/length) of NMOS transistor 431 is 10 µm/50 nm; capacitor 410 is 1 pF; resistor 421 is 100K Ohm; $V_{G1}$ is 600 mV; W/L of NMOS transistor 432 is 10 µm/30 nm; $V_{G2}$ is 850 mV; switch 422 is embodied by an NMOS transistor of 10 µm/250 nm in W/L; switch 423 in embodied by an NMOS transistor of 10 µm/250 nm in W/L; C1 is 3.3V when asserted and 0V otherwise; C1B is 3.3V when asserted and 0V otherwise; the resistance of the programmable resistor load 460 ranges from 50 Ohm to 400 Ohm; and a total parasitic capacitance at the drain of NMOS transistor 432 is 40 fF. A handover time is under 1 ns. A 3-dB bandwidth is approximately 10 GHz when the PGA 400 is programmable at the highest gain (i.e., when the resistance of the programmable resistor load 460 is set to its maximum value of 400 Ohm).

Analog-to-digital converters are well known in the prior art. A circuit designer can choose whatever suitable analog-to-digital converter circuit known in the prior art to embody ADC 140 at a discretion of the circuit designer. In an embodiment, the first clock CK1 is effectively 10 GHz but embodied by a 32-phase 600 MHz clock; ADC 140 is a 32-way time-interleaved SAR (successive approximation register) ADC with 7-bit resolution. Time-interleaved SAR ADC is well known in the prior art and thus not described in detail. ADC 140 is powered on when the first logical signal C1 is asserted and powered off otherwise. Powering off a circuit in accordance with a logical signal can be embodied using a power-cut switch controlled by the logical signal; this is frequently practiced in the prior art and thus not explained in detail.

Figure 5:
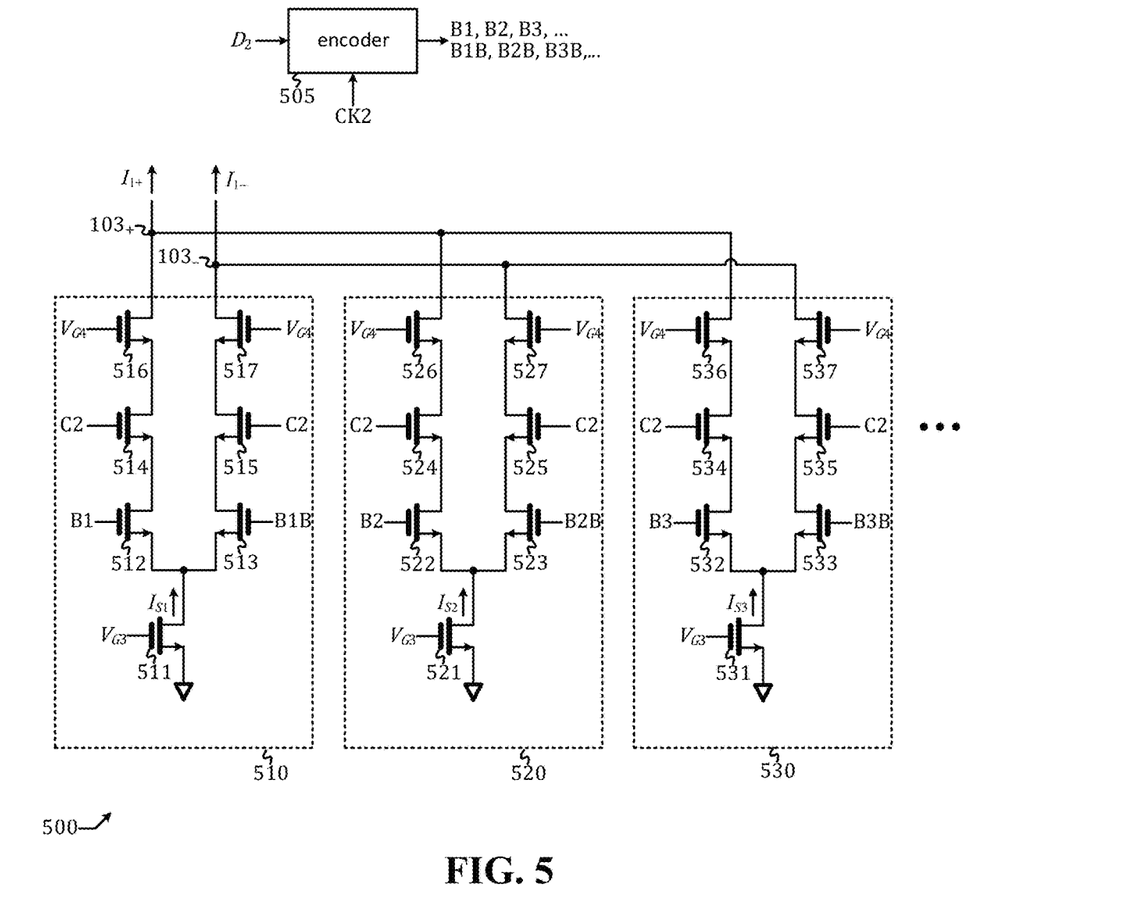
FIG. 5 shows a schematic diagram of a digital-to-analog converter that can be used in the TDD transceiver of FIG. 1.

In an embodiment, a schematic diagram of a DAC 500 that can be used to embody DAC 150 is shown in FIG. 5. DAC 500 comprises: an encoder 505 configured to encode the second data $D_2$ into a plurality of logical signals B1, B2, B3, and so on, along with their logical inversions B1B, B2B, B3B, and so on, respectively; a plurality of CML (current mode logic) circuits 510, 520, 530, and so on, configured to output a plurality of currents in accordance with a third gate voltage $V_{G3}$, the second logical signal C2, a fourth gate voltage $V_{G4}$, and said plurality of logical signals B1, B2, B3, and so on (along with their logical inversions B1B, B2B, B3B, and so on), respectively. The second data $D_2$ is encoded by encoder 505 into B1, B2, B3, and so on, in accordance with an encoding scheme; that is, logical signals B1, B2, B3, and so on, collectively embody the second data $D_2$ in accordance with said encoding scheme. In an embodiment, said encoding scheme is a "binary code" scheme; in another embodiment, said encoding scheme is a "thermometer code" scheme; both "binary code" and "thermometer code" are well known and thus not explained in detail. CML circuit 510 comprises seven NMOS transistors: 511, 512, 513, 514, 515, 516, and 517. CML circuit 520 comprises seven NMOS transistors: 521, 522, 523, 524, 525, 526, and 527. CML circuit 530 comprises seven NMOS transistors: 531, 532, 533, 534, 535, 536, and 537. NMOS transistor 511 (521, 531) embodies a current source configured to output a current $I_{S1}$ ($I_{S2}$, $I_{S3}$) in accordance with $V_{G3}$. When a "thermometer code" scheme is used, CML circuits 510, 520, 530, and so on, are all identical, thus $I_{S1}$, $I_{S2}$, and $I_{S3}$ are all the same; when a "binary code" scheme is used, CML circuit 520 is scaled down from CIVIL circuit 510 by a factor of two, and CIVIL circuit 530 is scaled down from CML circuit 520 by a factor of two, thus $I_{S2}$ is half of $I_{S1}$, and $I_{S3}$ is half of $I_{S2}$. Scaling down by a factor of two means: keep the same transistor length but reduce the transistor width by half.

In CIVIL circuit 510 (520, 530), NMOS transistors 512 (522, 532), 514 (524, 534), and 516 (526, 536) form a path for $I_{S1}$ ($I_{S2}$, $I_{S3}$) to flow to a "+" side (i.e. the left side in the schematics), while NMOS transistors 513 (523, 533), 515 (525, 535), and 517 (527, 537) form a path for $I_{S1}$ ($I_{S2}$, $I_{S3}$) to flow to a "−" side (i.e. the right side in the schematics); NMOS transistor 512 (522, 532) and 513 (523, 533) form a differential pair controlled by B1 (B2, B3) and B1B (B2B, B3B), respectively, configured to steer the current $I_{S1}$ ($I_{S2}$, $I_{S3}$) to either the "+" side or the "−" side; NMOS transistors 514 (524, 534) and 515 (525, 535) form a pair of switches configured to conditionally shut off the currents from NMOS transistors 512 (522, 532) and 513 (523, 533) in accordance with the second logical signal C2; NMOS transistors 516 (526, 536) and 517 (527, 537) form a cascode pair to relay currents from NMOS transistor 514 (524, 534) and 515 (525, 535), respectively. Currents of CML circuits 510, 520, 530, and so on, from the "+" side are summed at node 103+, resulting in current $I_{1+}$; currents of CML circuits 510, 520, 530, and so on, from the "−" side are summed at node 103−, resulting in current $I_{1-}$. When the second logical signal C2 is asserted, CIVIL circuits 510, 520, 530, and so on, are all turned on, and $I_{1+}$ and $I_{1-}$ are generated in accordance with B1, B2, B3, and so on, and thus in accordance with the second data $D_2$. When the second logical signal C2 is de-asserted, $I_+$ and $I_-$ are both zero.

By way of example but not limitation, in an embodiment: the second clock CK2 is a 10 GHz clock; $D_2$ is a 2-bit data with four possible values: 0, 1, 2, 3; the encoder 505 is a thermometer code encoder, and $D_2$ is encoded into three logical signals B1, B2, and B3, and each of the three logical signals is either 1V or 0V; the three CIVIL circuits 510, 520, and 530 are identical; W/L of transistor 511 is 40 µm/100 nm; $V_{G3}$ is 0.7V; W/L of NMOS transistors 512 and 513 are both 10 µm/30 nm; W/L of NMOS transistors 514 and 515 are both 10 µm/30 nm; the second logical signal C2 is either 1V when asserted or 0V otherwise; W/L of NMOS transistors 516 and 517 are both 10 µm/30 nm; $V_{G4}$ is 1.2V; and $I_{S1}$, $I_{S2}$, and $I_{S3}$ are 8 mA when C2 is asserted. The DAC 500 can have a fast handover and a fast response due to using a current mode circuit with NMOS transistors of short channel lengths that can have a fast switching in response to a rapid change of C2, B1, B2, B3, and so on. An impedance mismatch due to a parasitic capacitance at nodes $103_+$ and $103_-$ can be effectively alleviated by the broadband matching network 120, as explained earlier.

Figure 6:
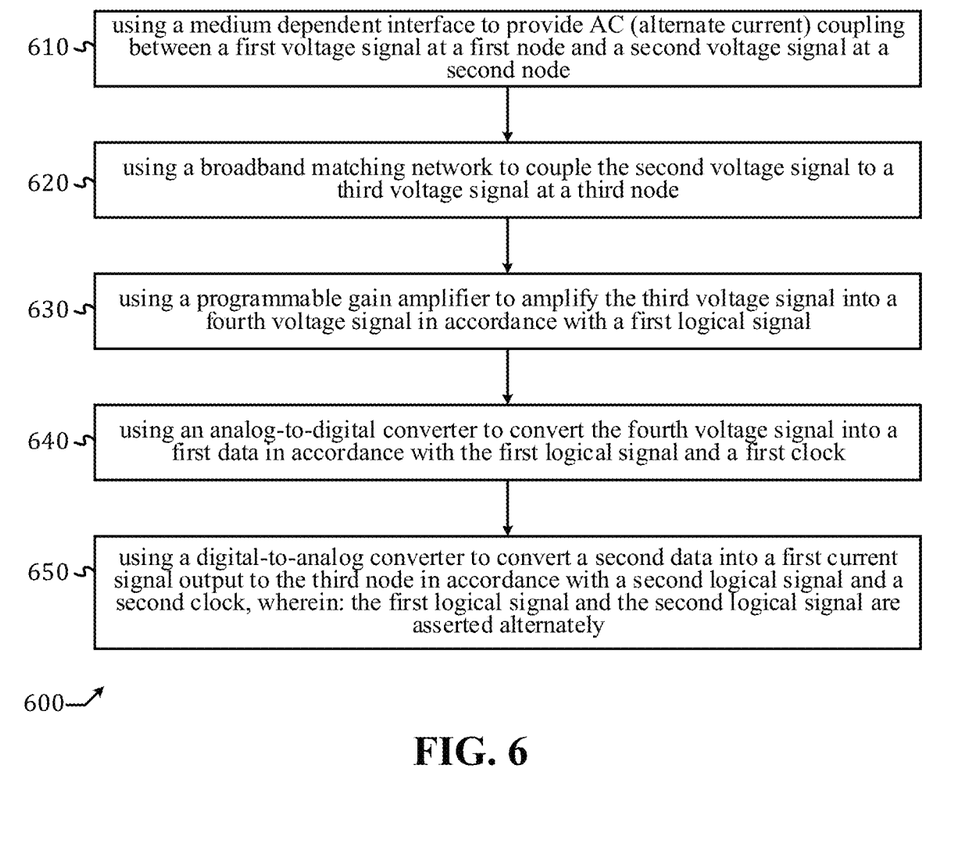
FIG. 6 shows a flow diagram of a method of a time division duplexing in accordance with an embodiment of the present disclosure.

As illustrated by a flow diagram 600 shown in FIG. 6, a method of time division duplexing in accordance with an embodiment of the present disclosure comprises: (step 610) using a medium dependent interface to provide AC (alternate current) coupling between a first voltage signal at a first node and a second voltage signal at a second node; (step 620) using a broadband matching network to couple the second voltage signal to a third voltage signal at a third node; (step 630) using a programmable gain amplifier to amplify the third voltage signal into a fourth voltage signal in accordance with a first logical signal; (step 640) using an analog-to-digital converter to convert the fourth voltage signal into a first data in accordance with the first logical signal and a first clock; and (step 650) using a digital-to-analog converter to convert a second data into a first current signal output to the third node in accordance with a second logical signal and a second clock, wherein: the first logical signal and the second logical signal are asserted alternately.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A transceiver comprising:
a medium dependent interface configured to provide AC (alternate current) coupling between a first voltage signal at a first node and a second voltage signal at a second node;
a broadband matching network 120 configured to couple the second voltage signal at the second node to a third voltage signal at a third node;
a programmable gain amplifier configured to receive the third voltage signal and output a fourth voltage signal in accordance with a first logical signal;
an analog-to-digital converter configured to receive the fourth voltage signal and output a first data in accordance with the first logical signal and a first clock; and
a digital-to-analog converter configured to receive a second data and output a first current signal to the third node in accordance with a second logical signal and a second clock, wherein the first logical signal and the second logical signal are asserted alternately.

2. The transceiver of claim 1, wherein the first node is coupled to a remote transceiver via a communication medium.

3. The transceiver of claim 2, wherein the communication medium is a cable of a characteristic impedance.

4. The transceiver of claim 3, wherein the medium dependent interface comprises a transformer.

5. The transceiver of claim 3, wherein the medium dependent interface comprises a common-mode choke in series with a capacitor.

6. The transceiver of claim 3, wherein: the broadband matching network comprises an impedance matching resistor coupled to the second node via a T-coil inductor including a series connection of a pair of coupled inductors with a center tap connected to the third node, an ESD (electrostatic discharge) diode configured to couple the third node to ground, and a capacitor in parallel with the T-coil inductor.

7. The transceiver of claim 3, wherein the programmable gain amplifier comprises: a common-source amplifier configured to receive the third voltage signal via an AC (alternate current) coupling capacitor, a programmable resistor load configured to determine a gain of the common-source amplifier, and a controllable bias network configured to determine a biasing condition of the common-source amplifier in accordance with the first logical signal.

8. The transceiver of claim 3, wherein the first clock is a multi-phase clock and the analog-to-digital converter is a time-interleaved SAR (successive approximation register) analog-to-digital converter.

9. The transceiver of claim 3, wherein the digital-to-analog converter comprises: an encoder configured to encode the second data into a plurality of logical signals in accordance with an encoding scheme; and a plurality of CIVIL (current-mode logic) circuits configured to jointly output the first current signal, said plurality of CML circuits being controlled by said plurality of logical signals, respectively, and the second logical signal.

10. The transceiver of claim 9, wherein the encoding scheme is a thermometer code scheme.

11. A method of time division duplexing comprising:
using a medium dependent interface to provide AC (alternate current) coupling between a first voltage signal at a first node and a second voltage signal at a second node;
using a broadband matching network to couple the second voltage signal to a third voltage signal at a third node;
using a programmable gain amplifier to amplify the third voltage signal into a fourth voltage signal in accordance with a first logical signal;
using an analog-to-digital converter to convert the fourth voltage signal into a first data in accordance with the first logical signal and a first clock; and
using a digital-to-analog converter to convert a second data into a first current output to the third node in accordance with a second logical signal and a second clock, wherein: the first logical signal and the second logical signal are asserted alternately.

12. The method of time division duplexing of claim 11, wherein the first node is coupled to a remote transceiver via a communication medium.

13. The method of time division duplexing of claim 12, wherein the communication medium is a cable of a characteristic impedance.

14. The method of time division duplexing of claim 13, wherein the medium dependent interface comprises a transformer.

15. The method of time division duplexing of claim 13, wherein the medium dependent interface comprises a common-mode choke in series with a capacitor.

16. The method of time division duplexing of claim 13, wherein: the broadband matching network comprises an impedance matching resistor coupled to the second node via a T-coil inductor including a series connection of a pair of coupled inductors with a center tap connected to the third node, an ESD (electrostatic discharge) diode configured to couple the third node to ground, and a capacitor in parallel with the T-coil inductor.

17. The method of time division duplexing of claim 13, wherein the programmable gain amplifier comprises: a common-source amplifier configured to receive the third voltage signal via an AC (alternate current) coupling capacitor, a programmable resistor load configured to determine a gain of the common-source amplifier, and a controllable bias network configured to determine a biasing condition of the common-source amplifier in accordance with the first logical signal.

18. The method of time division duplexing of claim 13, wherein the first clock is a multi-phase clock and the analog-to-digital converter is a time-interleaved SAR (successive approximation register) analog-to-digital converter.

19. The method of time division duplexing of claim 13, wherein the digital-to-analog converter comprises: an encoder configured to encode the second data into a plurality of logical signals in accordance with an encoding scheme; and a plurality of CIVIL (current-mode logic) circuits configured to jointly output the first current signal, said plurality of CML circuits being controlled by said plurality of logical signals, respectively, and the second logical signal.

20. The method of time division duplexing of claim 19, wherein the encoding scheme is a thermometer code scheme.

* * * * *